United States Patent
Hoeft et al.

(10) Patent No.: US 8,113,012 B2
(45) Date of Patent: Feb. 14, 2012

(54) INTER-RACK AIRFLOW ARRESTING APPARATUS AND METHOD FOR FACILITATING COOLING OF AN ELECTRONICS RACK OF A DATA CENTER

(75) Inventors: Allan R. Hoeft, Poughkeepsie, NY (US); Madhusudan K. Iyengar, Woodstock, NY (US); Francis R. Krug, Jr., Highland, NY (US); Steven C. McIntosh, Kingston, NY (US); Matthew A. Nobile, Poughkeepsie, NY (US); Donald W. Porter, Highland, NY (US); Roger R. Schmidt, Poughkeepsie, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 1120 days.

(21) Appl. No.: 11/942,815

(22) Filed: Nov. 20, 2007

(65) Prior Publication Data

US 2009/0129000 A1 May 21, 2009

(51) Int. Cl.
*H05K 7/20* (2006.01)
*F25D 23/12* (2006.01)

(52) U.S. Cl. .................................. 62/407; 62/259.2

(58) Field of Classification Search ............. 361/679.01, 361/690, 687; 62/407, 259.2; 181/201, 205; D23/387; 83/881; 229/207; 248/909; 40/754
See application file for complete search history.

(56) References Cited

U.S. PATENT DOCUMENTS

| | | | | |
|---|---|---|---|---|
| 3,117,535 | A | * | 1/1964 | Hendrickson .................... 108/60 |
| 3,232,333 | A | * | 2/1966 | Dixon ............................ 160/183 |
| 3,797,879 | A | * | 3/1974 | Edwards ..................... 296/180.4 |
| 3,866,967 | A | * | 2/1975 | Landry et al. ............... 296/180.4 |

(Continued)

FOREIGN PATENT DOCUMENTS

GB 2 155 972 A1 10/1985
(Continued)

OTHER PUBLICATIONS

IBM Technical Disclosure Bulletin, "Air-Cooling Scheme Having Enhanced Acoustic Performance," Aug. 1, 1979, NN79081108, vol. 22, Issue 3, pp. 1108-1110.*

(Continued)

*Primary Examiner* — Steven B McAllister
*Assistant Examiner* — Phillip E Decker
(74) *Attorney, Agent, or Firm* — Dennis Jung, Esq.; Kevin P. Radigan, Esq.; Heslin Rothenberg Farley & Mesiti P.C.

(57) ABSTRACT

An airflow arrester is provided and configured to reside between electronics racks disposed in a row within a data center. The airflow arrester includes a panel, which when operatively disposed, has a first vertical end, a second vertical end, and a central vertical hinge located intermediate the first and second vertical ends. The airflow arrester further includes an attachment mechanism at the first vertical end and at the second vertical end, and when operatively disposed between a first and second structures, the airflow arrester has a single V-shaped configuration, and is sized and constructed to block airflow from passing therebetween. The single V-shaped configuration provides operational stability to the airflow arrester by translating net twisting forces applied to the airflow arrester to normal forces applied to the first and second structures at the attachment points of the airflow arrester to the first and second structures.

13 Claims, 9 Drawing Sheets

U.S. PATENT DOCUMENTS

| | | | | |
|---|---|---|---|---|
| 3,977,716 | A * | 8/1976 | Whited | 296/180.4 |
| 4,103,957 | A * | 8/1978 | Landry et al. | 296/180.4 |
| 4,304,291 | A * | 12/1981 | Carter | 165/129 |
| 4,840,422 | A * | 6/1989 | Engel | 296/180.4 |
| 5,450,694 | A * | 9/1995 | Goranson et al. | 52/71 |
| 5,813,430 | A * | 9/1998 | De Leon | 137/318 |
| 5,819,492 | A * | 10/1998 | Konicek | 52/641 |
| 6,104,608 | A | 8/2000 | Casinelli | |
| 6,481,527 | B1 | 11/2002 | French | |
| 7,047,576 | B2 * | 5/2006 | Tavivian | 4/596 |
| 7,213,632 | B1 * | 5/2007 | Goldstein et al. | 160/135 |
| 7,403,391 | B2 * | 7/2008 | Germagian et al. | 361/695 |
| 7,656,660 | B2 * | 2/2010 | Hoeft et al. | 361/679.51 |
| 7,783,055 | B2 * | 8/2010 | Barath et al. | 381/71.3 |
| 7,804,685 | B2 * | 9/2010 | Krietzman | 361/690 |
| 2003/0151894 | A1 | 8/2003 | Singer | |
| 2003/0155099 | A1 * | 8/2003 | Montague, Jr. | 165/47 |
| 2003/0155100 | A1 * | 8/2003 | Montague, Jr. | 165/53 |
| 2004/0218355 | A1 * | 11/2004 | Bash et al. | 361/690 |
| 2005/0193761 | A1 * | 9/2005 | Vogel et al. | 62/407 |
| 2006/0185931 | A1 | 8/2006 | Kawar | |
| 2006/0260338 | A1 * | 11/2006 | VanGilder et al. | 62/259.2 |
| 2007/0064391 | A1 | 3/2007 | Lewis, II | |
| 2009/0107652 | A1 * | 4/2009 | VanGilder et al. | 165/80.2 |
| 2010/0061057 | A1 * | 3/2010 | Dersch et al. | 361/690 |

FOREIGN PATENT DOCUMENTS

| | | |
|---|---|---|
| WO | WO 91/08358 A | 6/1991 |

OTHER PUBLICATIONS

MailersCo.com, "Heavy Duty Jewel Case Mailer," Jan. 18, 2006, http://web.archive.org/web/20060118031508/www.mailersco.com/cdsleeves.htm.*

"Inter-Rack Flow Seperator to Prevent Computer Rack Hot Exhaust Air Entry Into Cold Region at Rack Inlet of Computer Data Center Facilities", IBM, ip.com, Prior Art Database, ip.com No. IPCOM000137460D, pp. 1-4 (Jun. 20, 2006).

"Notification of Transmittal of the International Search Report and the Written Opinion of the International Searching Authority, or the Declaration", mailed Mar. 19, 2009, International Application No. PCT/EP2008/065737 (13 pgs.).

* cited by examiner

INTER-RACK AIRFLOW ARRESTING APPARATUS AND METHOD FOR FACILITATING COOLING OF AN ELECTRONICS RACK OF A DATA CENTER

TECHNICAL FIELD

The present invention relates in general to apparatuses and methods for facilitating cooling of rack-mounted assemblages of individual electronics units, such as rack-mounted computer server units, and more particularly, to apparatuses and methods for arresting airflow from a hot air aisle of a data center to a cold air aisle of the data center.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

In addition, with the large number of electronics racks in many data center installations, the acoustic noise generated by both the fans in the electronics racks circulating air through the racks, and the fans of the computer room air conditioning units required to cool the data center are rising to unacceptably high levels.

SUMMARY OF THE INVENTION

The shortcomings of the prior art are overcome and additional advantages are provided through the provision of an apparatus comprising an airflow arrester. The airflow arrester includes a panel, which when operatively disposed, comprises a first vertical end, a second vertical end, and a central vertical hinge located intermediate the first vertical end and the second vertical end. The airflow arrester further includes an attachment mechanism at the first vertical end and an attachment mechanism at the second vertical end for facilitating securing of the first vertical end and the second vertical end respectively to one of a first structure and a second structure. When operatively disposed between the first and second structures, the airflow arrester has a single V-shaped configuration and is sized and constructed to block airflow from passing between the first and second structures. The single V-shaped configuration provides operational stability to the airflow arrester by translating a net twisting force applied to the airflow arrester to normal forces applied to the first and second structures.

In a further aspect, a data center is provided which includes a plurality of electronics racks aligned in a row and at least one airflow arrester. Each electronics rack includes an air inlet side and an air outlet side for facilitating ingress and egress of external air through the electronics rack. The air inlet sides of the electronics racks are disposed facing a cold air aisle of the data center, and the air outlet sides of the electronics racks are disposed facing a hot air aisle of the data center. Each airflow arrester includes a panel comprising a first vertical end, a second vertical end, and a central vertical hinge located intermediate the first vertical end and the second vertical end, as well as an attachment mechanism at the first vertical end for securing the first vertical end to a first structure comprising one of an electronics rack of the plurality of electronics racks or a vertical end of another airflow arrester, and an attachment mechanism at the second vertical end for securing the second vertical end to a second structure comprising one of an electronics rack of the plurality of electronics racks or a vertical end of another airflow arrester. Each airflow arrester further has a single V-shaped configuration, and is sized and configured to block airflow from passing between the first and second structures. The single V-shaped configuration translates a net twisting force applied to the airflow arrester to normal forces applied to the first and second structures at the first vertical end and second vertical end of the panel.

In a further aspect, a method of facilitating cooling of an electronics rack is provided. The method includes: employing an airflow arrester to block airflow between a first structure and a second structure within a data center, the airflow arrester including a panel comprising a first vertical end, a second vertical end and a central vertical hinge located intermediate the first vertical end and the second vertical end, wherein the employing includes securing the first vertical end to the first structure and securing the second vertical end to the second structure, wherein the airflow arrester is disposed between the first and second structures and has a single V-shaped configuration, and a size and construction to block airflow from passing between the first and second structures, wherein the single V-shaped configuration provides operational stability to the airflow arrester by translating a net twisting force applied to the airflow arrester to normal forces applied to the first and second structures.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. Further, "data center" refers to a computer installation containing one or more electronics racks to be cooled. As a specific example, a data center may include one or more rows of rack-mounted units, such as server units.

Reference is made below to the drawings, which are not drawn to scale for reasons of understanding, wherein the same reference numbers used throughout different figures designate the same or similar components.

Figure 1:
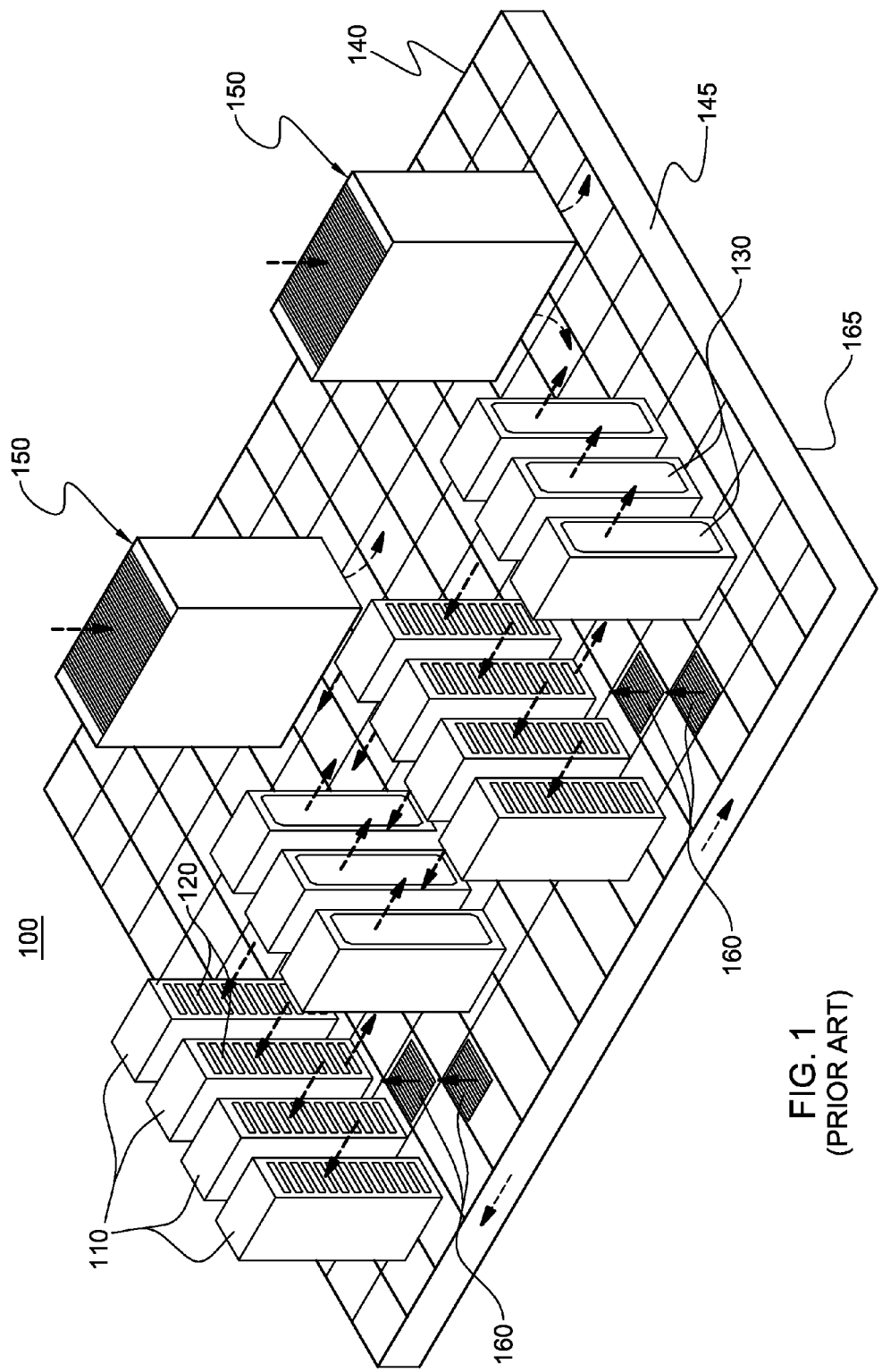
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Also, as illustrated, the electronics racks 110 within a row of data center 100 are spaced apart. This is to ensure a greater supply of cooled air from perforated floor tiles 100 for each electronics rack.

Figure 2:
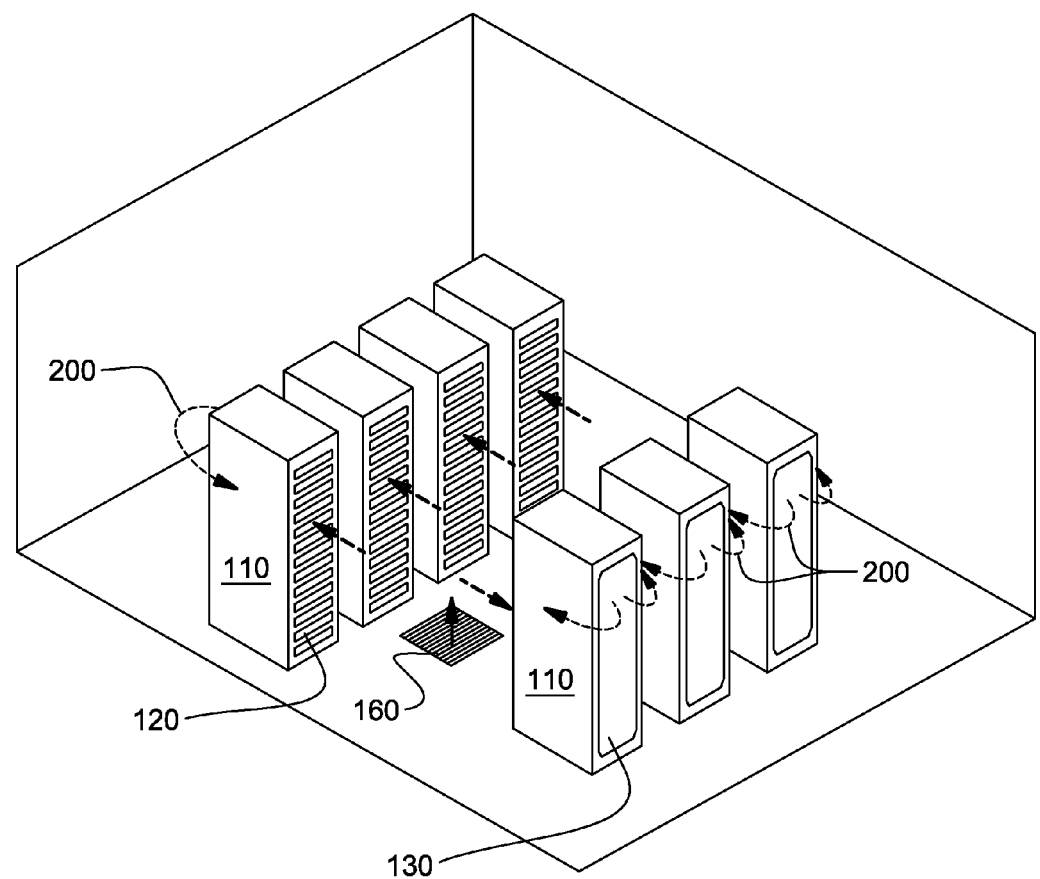
FIG. 2 depicts one problem addressed by the present invention, showing recirculation airflow patterns (in one implementation of a raised floor layout of an air-cooled data center) to be addressed by the apparatuses and methods disclosed herein, in accordance with an aspect of the present invention.

Due to the ever increasing airflow requirements through electronics racks, and limits of air distribution within the typical data center installation, recirculation problems within the room may occur. This is shown in FIG. 2 for a raised floor layout, wherein hot air recirculation 200 occurs from the air outlet sides 130 of the electronics racks 110 back to the cold air aisle defined by the opposing air inlet sides 120 of the electronics racks. This recirculation can occur because the conditioned air supplied through tiles 160 is only a fraction of the airflow rate forced through the electronics racks by the air moving devices disposed therein. This can be due, for example, to limitations on the tile sizes (or diffuser flow rates). The remaining fraction of the inlet side air supply is often made up by ambient room air through recirculation 200. This recirculating flow is often very complex in nature, and can lead to significantly higher rack unit inlet temperatures than desired.

The recirculation of hot exhaust air from the hot air aisle of the computer room installation to the cold air aisle can be detrimental to the performance and reliability of the computer system(s) or electronic system(s) within the racks. Also, computer installation equipment almost always represents a high capital investment to the customer. Thus, it is important from a product reliability and performance view point, and from a customer satisfaction and business perspective, to provide as uniform a temperature across the air inlet side of the rack unit as possible. The efficient cooling of such computer and electronic systems, and the amelioration of localized hot air inlet temperatures to one or more rack units due to recirculation of air currents, are addressed by the apparatuses and methods disclosed herein, as is reducing acoustic noise within a data center. Traditionally, higher air inlet temperatures to electronics racks have been addressed by increasing fan speeds within the rack units, however, this causes an increase in noise level within a data center. This is problematic since noise levels within the data center are already too high.

Attempts have been made in the art to address the recirculation problem. For example, reference an IP.com publication entitled "Inter-Rack Flow Separator to Prevent Computer Rack Hot Exhaust Air Entry Into Cold Region at Rack Inlet of Computer Data Center Facilities", published Jun. 20, 2006 as IP.com No. IPCOM000137470D. In this publication, a fan fold structure, a rolled-up flexible flow separator, and a sliding panel structure are disclosed for disposition between electronics racks in a data center. However, each of these embodiments has certain disadvantages associated therewith. The fan fold and rolled-up flexible flow separators tend to buckle under the force of air being applied against the separator, and therefore will fail to function over time, while the sliding plates configuration is cumbersome and expensive to implement. Thus, a need remains for an airflow arrester and arresting technique which are more reliable and cost effective than prior approaches.

Advantageously, the airflow arrester disclosed hereinbelow prevents hot air recirculation from a hot air aisle of a data center to the cold air aisle of the data center, and thereby facilitates cooling of the electronics racks within the data center, particularly when the racks are spaced apart, as illustrated in FIGS. 1 & 2. The airflow arrester can have several forms, as described below, but in each embodiment it operatively assumes a single V-shaped configuration which blocks air paths between structures within the data center. The airflow arrester can be employed to block any air path. For example, as described below, the airflow arrester may be positioned along the side of an electronics rack, between electronics racks, or even over the top of an electronics rack or other structure. The airflow arrester is configured for easy modification on site for installation in any location desired, and is hardware independent in that it can be installed with a heterogeneous set of structures within the data center. Also, once installed, the airflow arrester may be subsequently removed and then reinstalled, for example, to accommodate a reconfiguration of the data center. Advantageously, cost of the airflow arrester described herein is relatively low, and the airflow arrester can be designed with any color to aesthetically compliment the data center.

Figure 3:
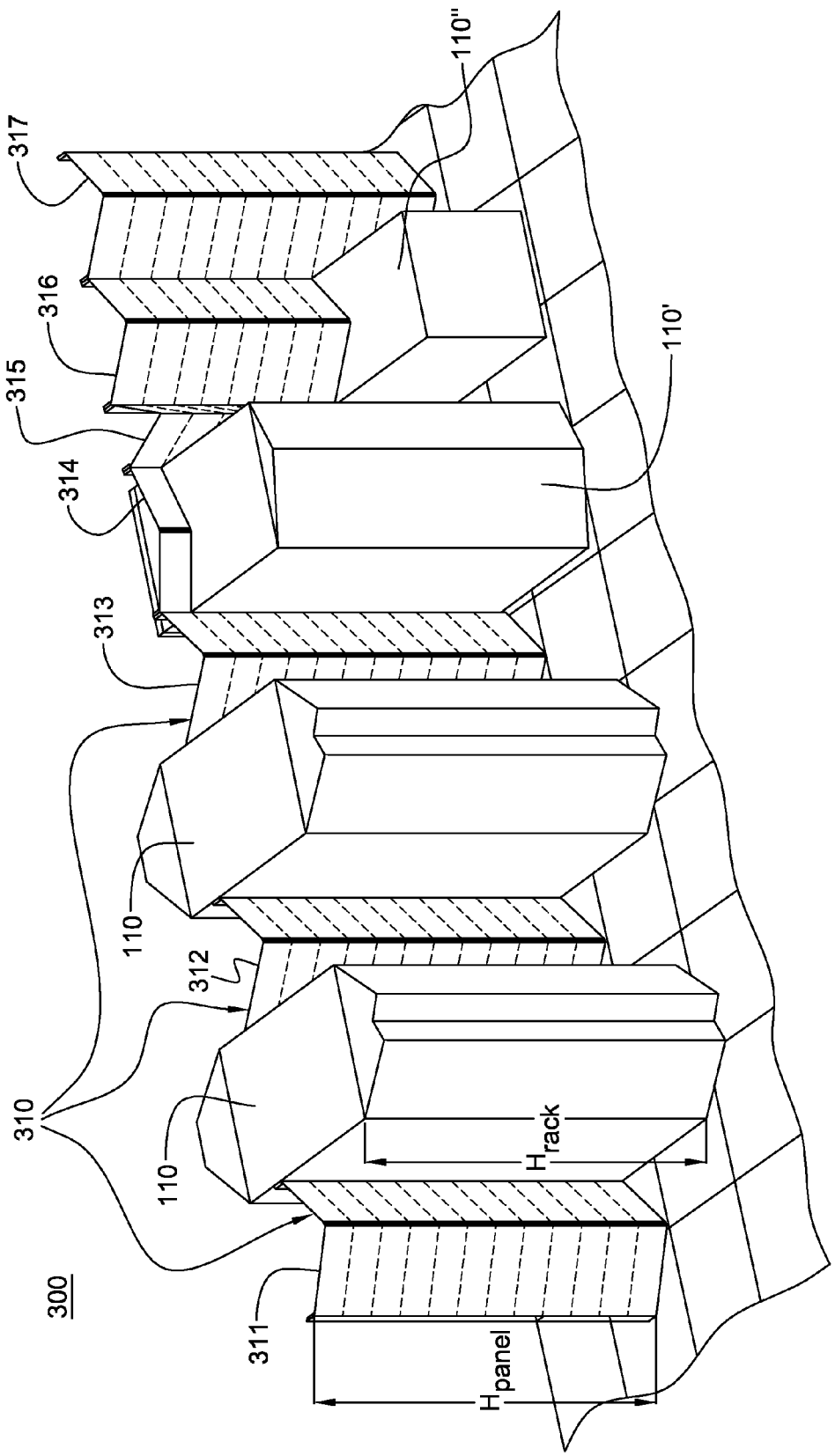
FIG. 3 is a partial depiction of a data center comprising a row of electronics racks with multiple airflow arresters operatively disposed therebetween for arresting airflow between a hot air aisle and cold air aisle of the data center, in accordance with an aspect of the present invention.

FIG. 3 is a partial embodiment of a data center, generally denoted 300, comprising a row of a plurality of electronics racks 110, 110' and 110". As illustrated, the electronics racks are spaced apart and a plurality of airflow arresters 310 are disposed in operative positions along, between and over the various electronics racks. Specifically, a first airflow arrester 311 is disposed along a first rack side of the leftmost electronics rack 110. As explained further below, each airflow arrester comprises a panel, and the panel of airflow arrester 311 has a panel height $H_{panel}$ which is approximately equal to the rack height $H_{rack}$ of the leftmost electronics rack 110. Airflow arrester 311 is secured to electronics rack 110 using one or more of the attachment mechanisms described hereinbelow.

A second airflow arrester 312 and a third airflow arrester 313 are shown in FIG. 3 to be disposed between opposing rack sides of adjacent electronics racks 110 (in the case of airflow arrester 312) and adjacent electronics racks 110, 110' (in the case of airflow arrester 313). Each airflow arrester 312, 313 is secured at its first and second ends to a respective one of the adjacent structures.

As illustrated in FIG. 3, airflow arrester 313 is also connected to another airflow arrester 314 using, for example, the same attachment mechanism (described below) as employed to attach the airflow arresters to the respective rack sides. As shown, airflow arrester 314 resides on top of electronics rack 110'. Another airflow arrester 315 connects airflow arrester 314 to a further airflow arrester 316, which as shown, resides on top of electronics rack 110". Finally, in this example, an airflow arrester 317 is connected to airflow arrester 316 and to a side of a differently configured electronics rack 110". As explained further below, each airflow arrester comprises a panel which when operatively positioned within the data center, assumes a V-shaped configuration, as illustrated in FIG. 3. An advantage of the airflow arrester described herein is that the panel can be readily configured to assume a desired panel height $H_{panel}$, such as depicted in FIG. 3 for airflow arrester 314 and airflow arrester 316. This can be accomplished, in one embodiment, by employing predefined horizontal score lines repeating throughout the height of the panel, for example, every six inches.

Airflow arresters 311, 312, 313, 314, 315, 316 & 317 are sized and constructed to effectively block hot air recirculation from the adjacent hot air aisle to the adjacent cold air aisle of the data center by blocking airflow along the sides of the electronics racks, between the electronics racks, and over selected electronics racks. This advantageously facilitates cooling of the electronics racks by allowing colder air to be drawn into the air inlet sides of the racks. The airflow arresters depicted are constructed to be readily installed within the data center and modified on-site to fit the actual space or gap to be filled. Further, the airflow arresters 310 may extend a greater height above the electronics racks, including electronics racks 110, and additional airflow arresters may be employed above electronics racks 110 such as airflow arresters 314 & 316 above electronics racks 110' & 110". In one alternate embodiment, the airflow arresters may extend at least several feet above each electronics rack in the row of electronics racks.

Figure 4:
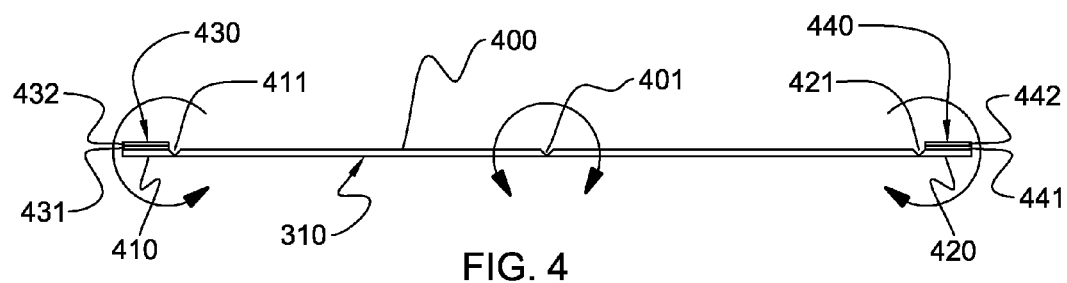
FIG. 4 is a top plan view of an airflow arrester positioned flat for storage or shipping, in accordance with an aspect of the present invention.

FIG. 4 is a top plan view of one embodiment of airflow arrester 310. As shown, airflow arrester 310 comprises a panel 400 with a single, central vertical hinge 401 disposed intermediate a first vertical end 410 and a second vertical end 420 (and not necessarily equidistance therebetween). First vertical end 410 further includes a first vertical end hinge 411, and second vertical end 420 includes a second vertical end hinge 421. As illustrated, the central vertical hinge 401, first vertical end hinge 411 and second vertical end hinge 421 are each defined by integral notches formed within panel 400. These integral notches extend vertically for the height of the panel (see FIG. 3). In this embodiment, a separable attachment mechanism 430 resides at first vertical end 410 and a separable attachment mechanism 440 resides at second vertical end 420. Each separable attachment mechanism 430, 440 may comprise a first layer 431, 441 and a second layer 432, 442 respectively, with the first and second layers separating, as explained further below with reference to FIG. 5.

Figure 5:
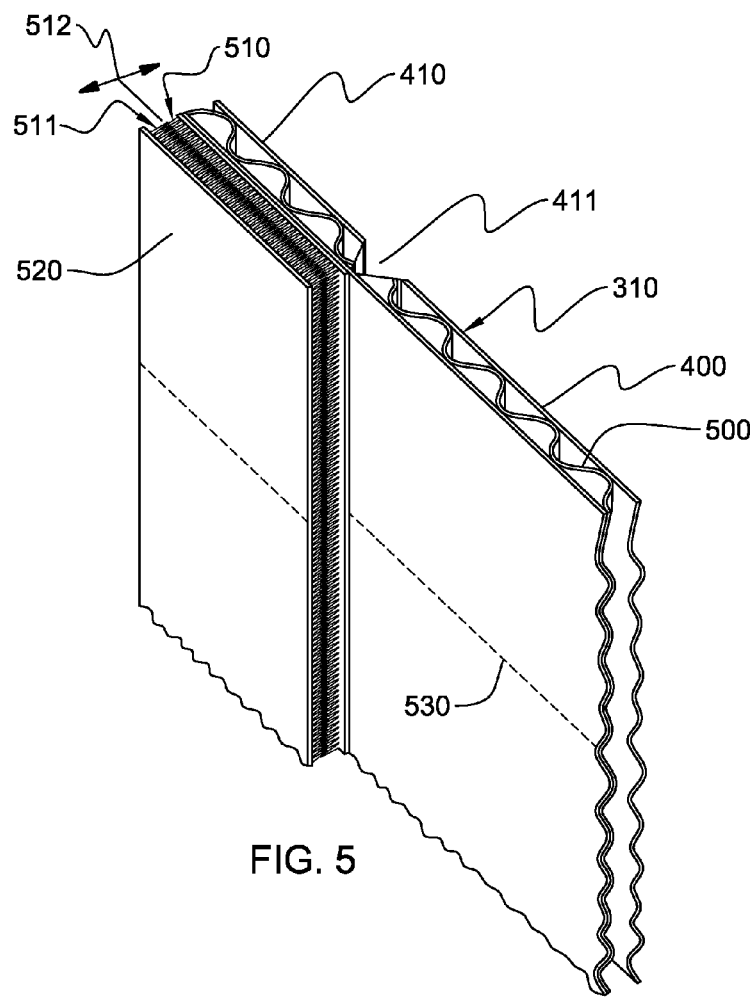
FIG. 5 is a partial isometric view of the airflow arrester of FIG. 4, showing details of one embodiment of the panel and an attachment mechanism for securing one end of the panel to, for example, a side of an electronics rack, in accordance with an aspect of the present invention.

FIG. 5 is a partial depiction of one detailed embodiment of airflow arrester 310. As noted, airflow arrester 310 comprises a panel 400, which in the embodiment illustrated, is corrugated 500 throughout a center portion thereof, for enhancing strength while minimizing weight of the airflow arrester. In the partial depiction, first vertical end 410 is shown, as well as first vertical end hinge 411, formed as an integral notch within panel 400. In this embodiment, the separable attachment mechanism comprises a hook and loop type fastener, wherein in one embodiment, hooks 510 are secured to first vertical end 410, and loops 511 are secured to an adhesive strip 520, which has a width approximately equal to the width of first vertical end 410 and a height approximately equal to the panel height (see FIG. 3). Hooks 510 and loops 511 are separable along their interface 512. As is known in the art, the hook side of a hook and loop type fastener comprises a piece of fabric covered with small plastic hooks, while the loop side is covered with an even smaller, higher density number of plastic loops.

In one embodiment, the airflow arrester is formed of a plastic material and the plastic is notched vertically to form the integral hinges described above. Additionally, the plastic may be provided with one or more score lines 530, for example, in regular increments for the height of the panel, to facilitate breaking of the plastic panel horizontally to adapt the panel to a particular data center installation. In one example, the horizontal score lines may be employed to create shorter airflow arresters, such as airflow arresters 314, 316 depicted in FIG. 3.

Figure 6:
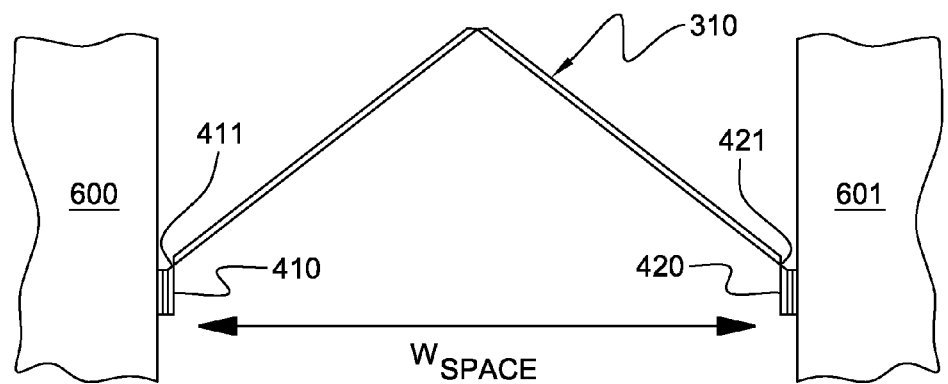
FIG. 6 is a top plan view of the airflow arrester of FIG. 4, shown operatively positioned between a first structure and a second structure, in accordance with an aspect of the present invention.

FIG. 6 illustrates airflow arrester 310 disposed operatively between a first structure 600 and a second structure 601. In one embodiment, the first and second structures 600, 601 each comprise an electronics rack, or other data processing equipment, or alternatively, another airflow arrester such as described herein and depicted, for example, in FIG. 3. As illustrated, airflow arrester 310 assumes a single V-shaped configuration when operatively disposed between the first and second structures and fills the space $W_{space}$ therebetween. In one embodiment, panels of various widths may be employed to accommodate different ranges of spaces between structures. Further, in the embodiment illustrated, note that first vertical end hinge 411 and second vertical end hinge 421 allow first vertical end 410 and second vertical end 420 to mate flat with the respective first and second structures 600, 601. As explained further below, this facilitates translation of a net twisting moment on the airflow arrester to a normal force applied to the first and second structures, which enhances stability of the airflow arrester.

Figure 7:
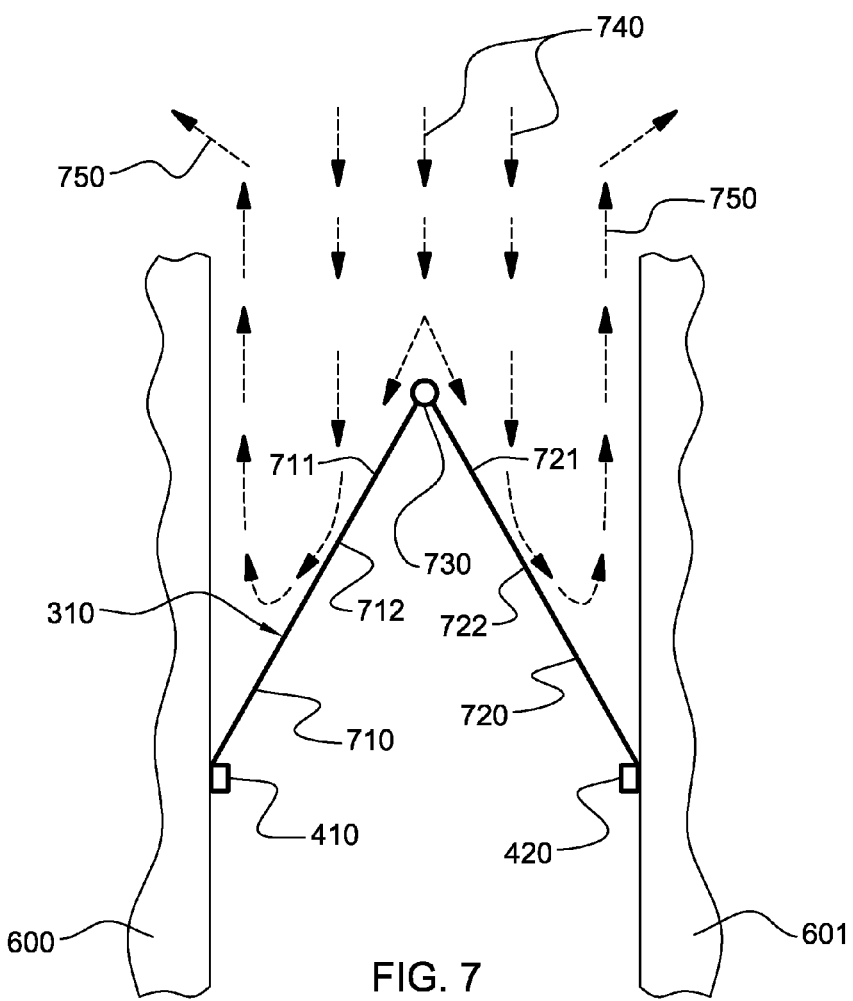
FIG. 7 is a top plan view of an airflow arrester shown operatively positioned between a first structure and a second structure, and illustrating arresting of airflow from a hot air aisle of a data center, in accordance with an aspect of the present invention.

FIG. 7 illustrates airflow arrester 310, again operatively positioned between a first structure 600 and a second structure 601, with first vertical end 410 secured to first structure 600 and second vertical end 420 secured to second structure 601. In this position, airflow arrester 310 has a single V-shaped configuration and includes a first arm panel 710 and a second arm panel 720, each of which has a leading side 711, 721 and a trailing side 712, 722. Hot air 740 flowing from, for example, a hot air aisle of a data center, is shown impacting on leading sides 711, 721 of the airflow arrester 310, which turn the hot air 740 for return 750 to the hot air aisle of the data center. More particularly, the single V-shaped configuration advantageously bifurcates high velocity hot air attempting to recirculate from the hot air aisle to the cold air aisle of the data center. The bifurcated hot air is turned 180° and returned back to the hot air aisle. As the air bifurcates it flows into and out of two triangular-shaped regions defined between the single V-shaped configuration of the airflow arrester and the sides of first structure 600 and second structure 601.

In this embodiment, the central vertical hinge disposed intermediate the first vertical end 410 and second vertical end 420 may comprise any commercially available pivoting hinge structure suitable for the airflow arrester. This pivoting hinge structure is an alternate embodiment to the integral notch embodiment described above in connection with FIGS. 4-6. In the embodiment illustrated, the hinge point 730 is located at the middle of the panel between the first vertical end 410 and second vertical end 420 such that panel arms 710 and 720 are of equal length (by way of example).

Figure 8B:
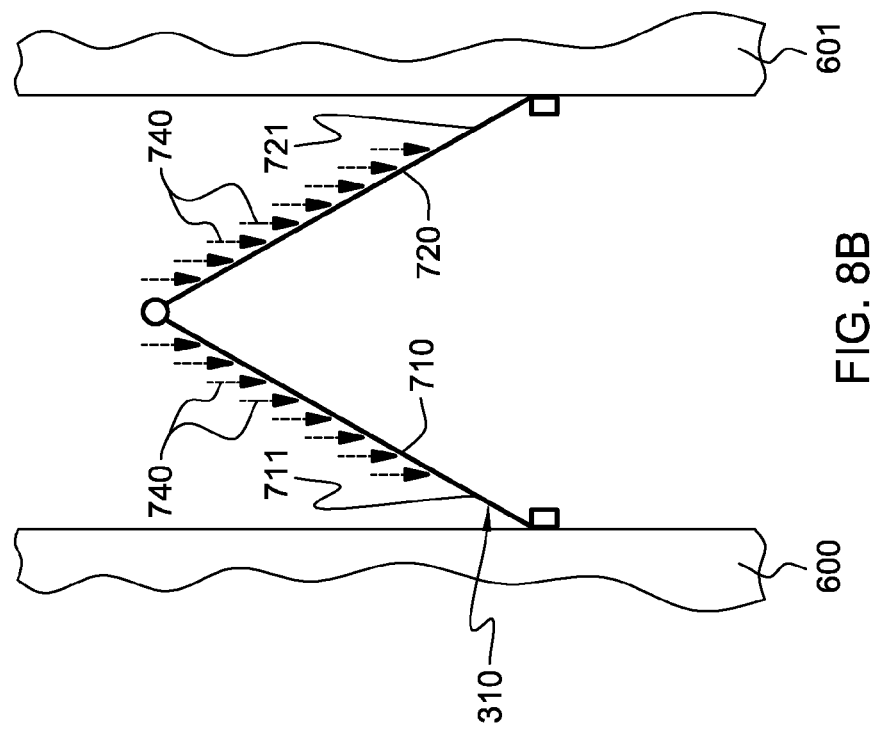
FIG. 8B is a top plan view of the airflow arrester of FIG. 7, illustrating momentum force of air acting against the leading panel side of the airflow arrester due to hot air flowing against the airflow arrester from the hot air aisle of a data center, in accordance with an aspect of the present invention.
Figure 8A:
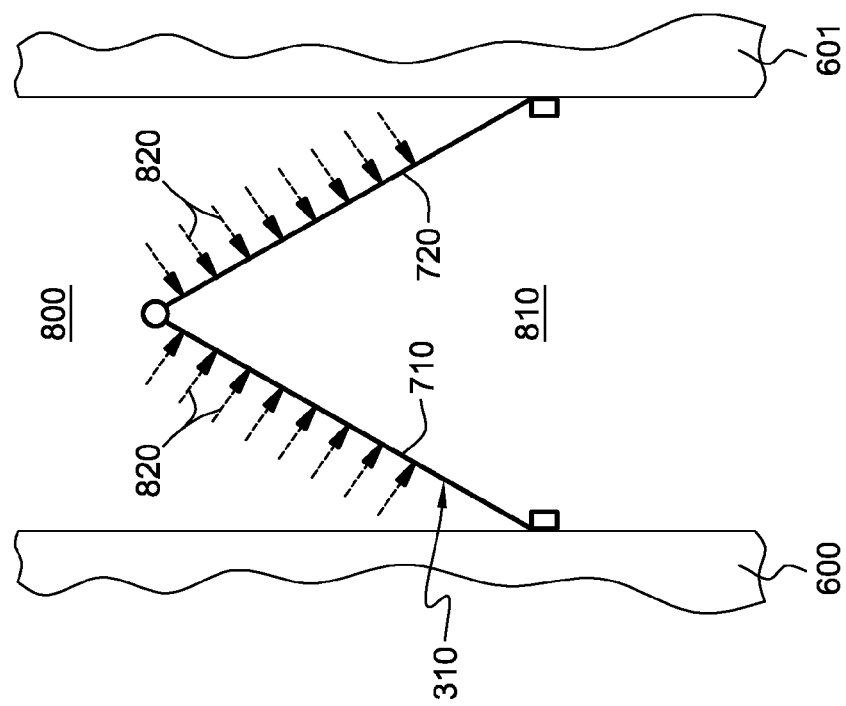
FIG. 8A is a top plan view of the airflow arrester of FIG. 7, illustrating pressure acting on the panel arms of the airflow arrester due to a pressure differential between the hot air aisle (higher pressure region) and the cold air aisle (lower pressure region), in accordance with an aspect of the present invention.
Figure 8D:
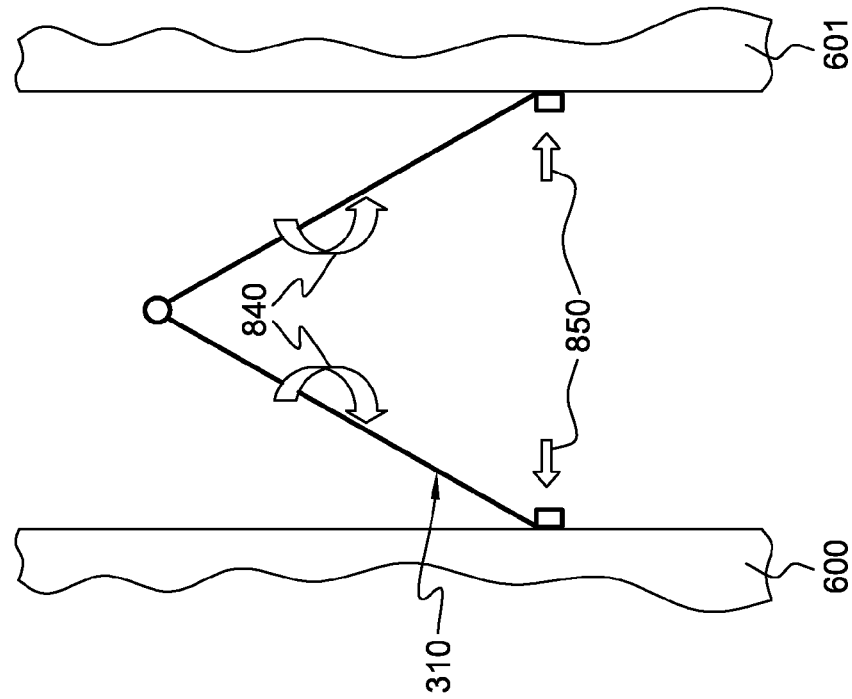
FIG. 8D is a top plan view of the airflow arrester of FIG. 7, illustrating net twisting moment for airflow that attempts to straighten the single V-shaped configuration of the airflow arrester and the translation of the twisting moment into normal forces that are transmitted to the first and second structures via the first and second vertical ends of the airflow arrester, in accordance with an aspect of the present invention.

FIGS. 8A-8D illustrate resultant forces acting on airflow arrester 310 of FIG. 7. Referring first to FIG. 8A, a higher pressure region 800 exists on the leading side 711, 721 of airflow arrester 310, compared with lower pressure region 810 on the trailing side 712, 722 thereof. This pressure differential between higher pressure region 800 and lower pressure region 810 results in a pressure 820 acting on panel arms 710, 720 of airflow arrester 310.

In addition to the pressure force caused by the pressure differential between the two separated regions, there is a momentum force exerted by the hot airflow 740 impacting the leading sides 711, 721 of panel arms 710, 720, as illustrated in FIG. 8B. This momentum force is exerted on arms 710, 720 as the hot airflow 740 impacts the panel arms of the airflow arrester and is forced to turn 180° to flow back out of the space between structures 600, 601.

Figure 8C:
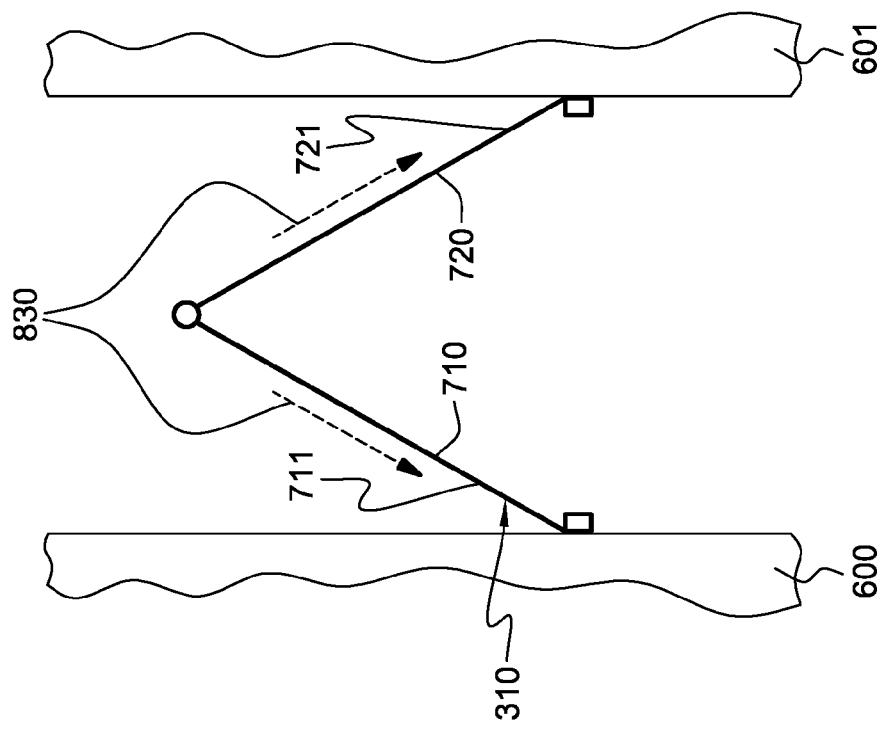
FIG. 8C is a top plan view of the airflow arrester of FIG. 7, illustrating resultant frictional shear drag force acting against the leading panel side of the airflow arrester due to hot air flowing against the airflow arrester from the hot air aisle of a data center, in accordance with an aspect of the present invention.

A third type of force acting on panel arms 710, 720 of airflow arrester 310 is depicted in FIG. 8C. This third type of force is a frictional sheer drag force 830 acting against leading sides 711, 721 of panel arms 710, 720. This frictional sheer force is exerted by the airflow as it flows over the leading sides of the airflow arrester's panel arms.

The result of the various forces acting on the single V-shaped airflow arrester is a net twisting moment 840 (see FIG. 8D) that tries to open the airflow arrester about the hinge point. This twisting moment 840 is transmitted via the V-shaped configuration and the hinged vertical ends into a normal force 850 applied to the sides of the supporting structures 600, 601. Normal force 850 is readily accommodated by the inherent rigidity of the first and second structures 600, 601, which in one embodiment, may comprise metallic rack frames. The arrester's attachment mechanism is not required to counter this perpendicular force from the hot air stream. Rather, the attachment mechanisms act to position the V-shaped arrester correctly within the space between the adjacent structures. The normal force is significantly different from the shear force that would have resulted without a single V-shaped configuration, and if a flat or straight arrester were employed, such as used in the prior art. In such a case, all the force is transmitted to the attachment mechanism rather than the structures themselves, which can ultimately result in detachment of the arrester. Also, a flat arrester, such as described above in the IP.com publication, will tend to bow in its middle, trying to break free from the attachment, thus making the net shear force even greater. Thus, the single V-shaped structure described herein is a more robust airflow arrester design than previously employed.

Figure 10:
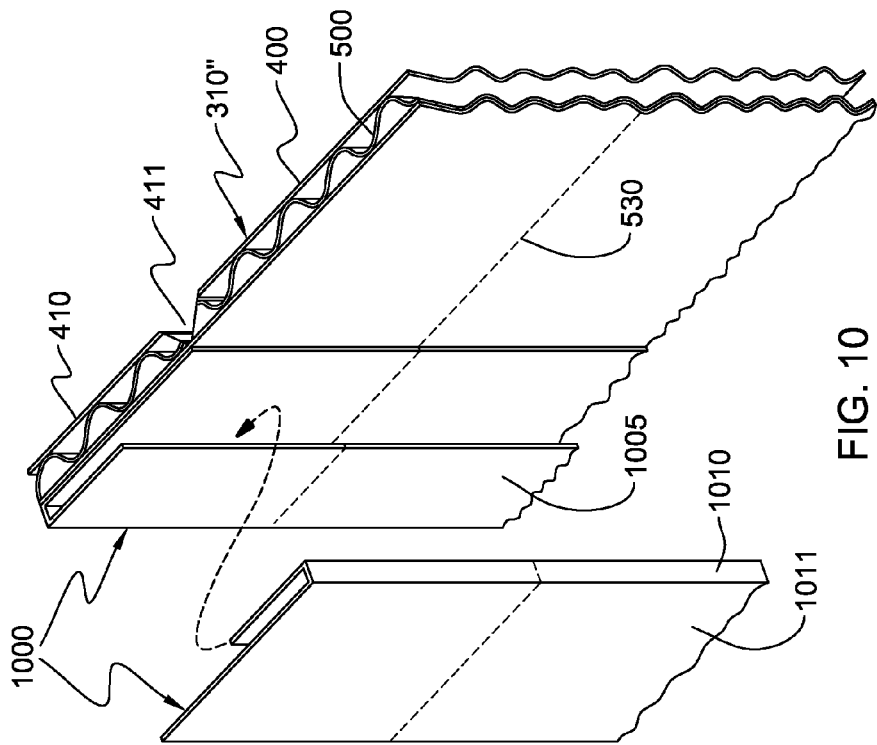
FIG. 10 is a partial isometric view of an another embodiment of an airflow arrester, wherein the illustrated attachment mechanism comprises mating U-shaped clips for securing the panel ends to respective structures, in accordance with an aspect of the present invention.
Figure 9:
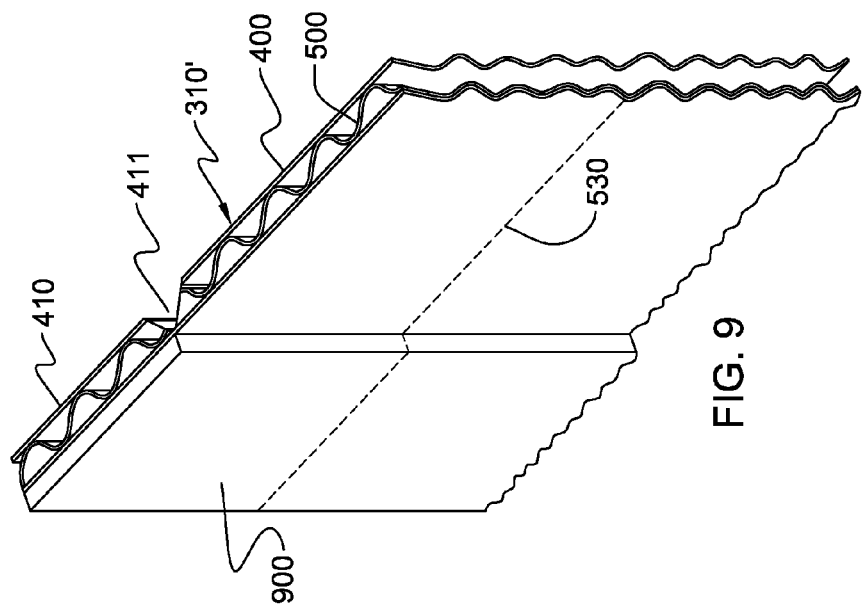
FIG. 9 is a partial isometric view of an alternate embodiment of an airflow arrester, wherein the illustrated attachment mechanism comprises a magnetic strip at the first vertical end of the airflow arrester, in accordance with an aspect of the present invention.

FIGS. 9 & 10 depict alternate embodiments of a separable attachment mechanism which may be employed at the first and second vertical ends of the airflow arrester described hereinabove. In FIG. 9, a partial airflow arrester 310' is partially shown. Airflow arrester 310' includes panel 400 with a corrugated center portion 500, and a first vertical end 410 defined by a first vertical end hinge 411 formed integral with panel 400. In this embodiment, a magnetic strip 900 is secured, for example, adhesively, to first vertical end 410. Magnetic strip 900 may have a width and height similar to the width and height of first vertical end 410 of panel 400. This configuration is particularly advantageous when employed with a metallic electronics rack structure, with the magnetic strip magnetically holding the airflow arrester in position, such as depicted above in connection with FIGS. 6-8D. One or more horizontal score lines 530 may be provided in panel 400, and in magnetic strip 900, to facilitate customization of the airflow arrester for a given space within a data center.

FIG. 10 depicts an alternate separable attachment mechanism 1000 for an airflow arrester 310", which comprises a panel 400 with a corrugated central portion 500 and a first vertical end 410 defined in part by a first vertical end hinge 411. In this embodiment, a first U-shaped clip 1005 is secured to first vertical end 410 of airflow arrester 310", while a second U-shaped clip 1010, is configured for attachment to a structure within the data center. For example, an adhesive backing 1011 may be employed on the back surface of U-shaped clip 1010 to attach the clip to the first or second structure. As shown in FIG. 10, the first U-shaped clip 1005 and second U-shaped clip 1010 are sized to engagably mate, and thereby secure first vertical end 410 to one of the first structure or second structure.

Figure 11:
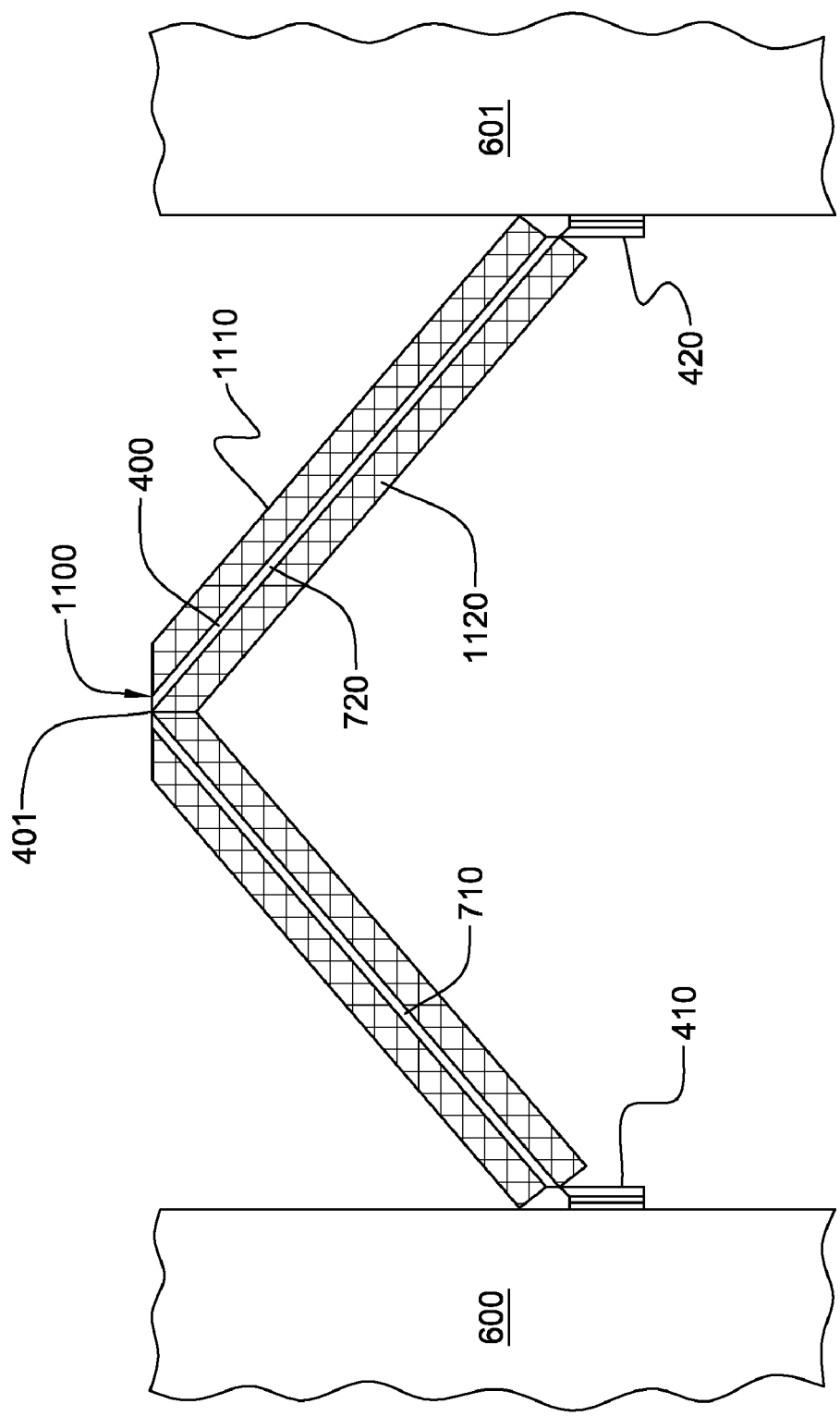
FIG. 11 is a top plan view of an alternate embodiment of an airflow arrester, wherein an acoustically absorbent material is employed on both panel sides to attenuate noise within a data center containing the first and second structures, in accordance with an aspect of the present invention.

FIG. 11 depicts an alternate embodiment of an airflow arrester, generally denoted 1100, in accordance with an aspect of the present invention. Airflow arrester 1100 includes a panel 400 with a single, central vertical hinge 401, and a first vertical end 410 and second vertical end 420, respectively attached to first structure 600 and second structure 601. When operatively positioned as shown within the space between first and second structures 600, 601, panel 400 is divided into a first panel arm 710 and a second panel arm 720, as described above. In this embodiment, panel arms 710, 720 are covered with an acoustically absorbent material 1110 on the leading sides thereof, and an acoustically absorbent material 1120 on the trailing sides thereof. This acoustically absorbent material is selected to attenuate noise within a data center containing (for example) a row of electronics racks between which the airflow arrester is disposed. In one example, the acoustically absorbent material comprises fiberglass or polyurethane foam.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus comprising:
  an airflow arrester, the airflow arrester comprising a panel which when operatively disposed includes a first vertical end, a second vertical end, and a central vertical hinge located intermediate the first vertical end and the second vertical end, and wherein the airflow arrester further comprises a first attachment mechanism at the first vertical end and a second attachment mechanism at the second vertical end for facilitating securing of the first vertical end and the second vertical end to a respective one of a first structure and a second structure, at least one of the first structure or the second structure comprising an electronics rack of a data center;
  wherein when operatively positioned between the first structure and the second structure, the airflow arrester has a single V-shaped configuration, and is sized and constructed to block airflow from passing between the first structure and the second structure, wherein the single V-shaped configuration provides operational stability to the airflow arrester by translating airflow forces applied to the airflow arrester in a first direction to normal forces applied to the first and second structures in a second direction, wherein the second direction is substantially perpendicular to the first direction;
  wherein the airflow arrester further comprises a first vertical hinge disposed adjacent to the first attachment mechanism at the first vertical end thereof and a second vertical hinge disposed adjacent to the second attachment mechanism at the second vertical end thereof, wherein with the airflow arrester operatively disposed between the first structure and the second structure, the first vertical end with the first attachment mechanism is in parallel opposing relation to and attached to a first side of the first structure and the second vertical end with the second attachment mechanism is in parallel opposing relation to and attached to a second side of the second structure, wherein the first vertical hinge and the second vertical hinge facilitate defining the single V-shaped configuration in combination with positioning of the first vertical end and the second vertical end in parallel opposing relation to the first side and the second side, respectively, of the first and second structures, thereby facilitating translating of airflow forces applied to the single V-shaped configuration of the airflow arrester to normal forces applied to the first and second sides of the first and second structures; and
  wherein the first structure comprises a first electronics rack, and the second structure comprises a second electronics rack, the first electronics rack and second electronics rack being spaced apart in a row within a data center, and wherein the first side comprises a first rack side of the first electronics rack and the second side comprises a second rack side of the second electronics rack, the first rack side and the second rack side being in spaced opposing relation, and wherein at least one of the first electronics rack or the second electronics rack has a rack height $H_{rack}$, and wherein the panel height $H_{panel}$ is greater than rack height $H_{rack}$ of the at least one first electronics rack or second electronics rack, and wherein the panel further comprises a plurality of horizontal score lines on each side of the central vertical hinge to facilitate customizing the panel height $H_{panel}$, each horizontal score line facilitating breaking of the panel along the horizontal score line, and at least two horizontal score lines of the plurality of horizontal score lines opposite sides of the central vertical hinge are aligned horizontal score lines.

2. The apparatus of claim 1, wherein the first vertical hinge is formed of a first integral notch in the panel and the second vertical hinge is formed of a second integral notch in the panel, and wherein the central vertical hinge located intermediate the first vertical end and the second vertical end is formed of another integral notch in the panel.

3. The apparatus of claim 2, wherein the panel comprises a corrugated panel configured to lie flat for storage and assume the single V-shaped configuration when operatively disposed between the first structure and the second structure.

4. The apparatus of claim 2, further comprising acoustically absorbent material disposed on each side of the panel to facilitate noise attenuation outside the first electronics rack and the second electronics rack.

5. The apparatus of claim 1, wherein the first attachment mechanism comprises one of a hook and loop type fastener, mating U-shaped clip fasteners, or a magnetic strip, wherein if a hook and loop type fastener, the apparatus further comprises a first adhesive strip for securing one of a hook portion or a loop portion of the hook and loop type fastener to the first rack side of the first electronics rack and the first vertical end of the panel comprises the other of the hook portion or loop portion of the hook and loop type fastener, and a second adhesive strip for securing one of the hook portion and loop portion to the second rack side of the second electronics rack and the second vertical end comprises the other of the hook portion or loop portion of the hook and loop type fastener, and wherein if mating U-shaped clip fasteners, the first attachment mechanism further comprises a first adhesive strip for securing a first U-shaped clip to the first rack side of the first electronics rack and a second adhesive strip for securing a second U-shaped clip to the second rack side of the second electronics rack, and wherein the first vertical end and the second vertical end each comprise U-shaped clips configured and sized for mating with a respective one of the first U-shaped clip or the second U-shaped clip.

6. The apparatus of claim 1, wherein the airflow arrester is a first airflow arrester, and wherein the apparatus further comprises a second airflow arrester comprising a second panel, which when operatively disposed includes a first vertical end sized and configured for mating with and attaching to a portion of one of the first vertical end or second vertical end of the first airflow arrester.

7. A data center comprising:
a plurality of electronics racks aligned in a row, each electronics rack of the plurality of electronics racks comprising an air inlet side and an air outlet side for facilitating ingress and egress of external air through the electronics rack wherein the air inlet sides of the electronics racks are disposed facing a cold air aisle of the data center and the air outlet sides of the electronics racks are disposed facing a hot air aisle of the data center;
at least one airflow arrester, each airflow arrester comprising a panel including a first vertical end, a second vertical end, and a central vertical hinge located intermediate the first vertical end and the second vertical end, and wherein each airflow arrester further comprises a first attachment mechanism at the first vertical end for securing the first vertical end to a first structure comprising one of an electronics rack of the plurality of electronics racks, or a vertical end of another airflow arrester, and a second attachment mechanism at the second vertical end for securing the second vertical end to a second structure comprising one of an electronics rack of the plurality of electronics racks or a vertical end of another airflow arrester;
wherein each airflow arrester of the at least one airflow arrester has a single V-shaped configuration and is sized and constructed to block airflow from passing between the first and second structures, wherein the single V-shaped configuration translates airflow forces applied to the airflow arrester in a first direction to normal forces applied to the first and second structures in a second direction, wherein the second direction is substantially perpendicular to the first direction;
wherein the airflow arrester further comprises a first vertical hinge disposed adjacent to the first attachment mechanism at the first vertical end thereof and a second vertical hinge disposed adjacent to the second attachment mechanism at the second vertical end thereof, wherein with the airflow arrester operatively disposed between the first structure and the second structure, the first vertical end with the first attachment mechanism is in parallel opposing relation to and attached to a first side of the first structure and the second vertical end with the second attachment mechanism is in parallel opposing relation to and attached to a second side of the second structure, wherein the first vertical hinge and the second vertical hinge facilitate defining the single V-shaped configuration in combination with positioning of the first vertical end and the second vertical end in parallel opposing relation to the first side and the second side, respectively, of the first and second structures, thereby facilitating translating of airflow forces applied to the single V-shaped configuration of the airflow arrester to normal forces applied to the first and second sides of the first and second structures; and
wherein the first structure comprises a first electronics rack of the plurality of electronics racks, and the second structure comprises a second electronics rack of the plurality of electronics racks, the first electronics rack and the second electronics rack being spaced apart in, the row of electronics racks, and wherein the first side comprises a first rack side of the first electronics rack and the second side comprises a second rack side of the second electronics rack, the first rack side and the second rack side being in spaced opposing relation, and wherein at least one of the first electronics rack or the second electronics rack has a rack height $H_{rack}$ and the panel has a panel height $H_{panel}$, the panel height $H_{panel}$ being greater than the rack height $R_{rack}$ of the at least one first electronics rack or second electronics rack, and wherein the panel further comprises a plurality of horizontal score lines on each side of the central vertical hinge to facilitate customization of panel height $H_{panel}$, each horizontal score line facilitating breaking; of the panel along the horizontal score line, and at least two horizontal score lines of the plurality of horizontal score lines on opposite sides of the central vertical hinge are aligned horizontal score lines.

8. The data center of claim 7, wherein the first vertical hinge is formed of a first integral notch in the panel and the second vertical hinge is formed of a second integral notch in the panel, and wherein the central vertical hinge located intermediate the first vertical end and the second vertical end is formed of another vertical notch in the panel.

9. The data center of claim 8, wherein the panel comprises a corrugated panel configured to lie flat for storage and assume the single V-shaped configuration when operatively disposed between the first structure and the second structure.

10. The data center of claim 8, further comprising acoustically absorbent material disposed on each side of the panel to facilitate noise attenuation outside the first electronics rack and the second electronics rack.

11. The data center of claim 7, wherein the airflow arrester is a first airflow arrester, and wherein the first structure is a second airflow arrester comprising a second panel including a first vertical end, a second vertical end, and a central vertical hinge located intermediate the first vertical end and the second vertical end, and wherein the second airflow arrester includes a first attachment mechanism at the first vertical end and a second attachment mechanism at the second vertical end, wherein the second attachment mechanism at the second vertical end of the second airflow arrester is secured to the first attachment mechanism at the first vertical end of the first airflow arrester.

12. The data center of claim 11, wherein the first and second attachment mechanisms at the first vertical ends and second vertical ends of the first airflow arrester and the second airflow arrester comprise one of hook and loop type fasteners, mating U-shaped clip fasteners or magnetic strips.

13. A method of facilitating cooling of an electronics rack, the method comprising:

employing an airflow arrester to block airflow between a first structure and a second structure within a data center, the airflow arrester comprising a panel including a first vertical end, a second vertical end and a central vertical hinge located intermediate the first vertical end and the second vertical end, wherein the employing comprises securing the first vertical end to the first structure and securing the second vertical end to the second structure, wherein the airflow arrester disposed between the first and second structures has a single V-shaped configuration, and is sized and constructed to block airflow from passing between the first and second structures, wherein the single V-shaped configuration provides operational stability to the airflow arrester by translating airflow forces applied in a first direction to the airflow arrester to normal forces applied to the first and second structures; and wherein the airflow arrester comprises a first airflow arrester, the first structure comprises a first electronics rack, the second structure comprises a second electronics rack, and a rack height $H_{rack}$ of the first electronics rack is greater than a rack height $H_{rack}$ of the second electronics rack, and wherein the method further comprises customizing a second airflow arrester to reside over the second electronics rack, and securing one vertical end of the second airflow arrester to one of the first vertical end or second vertical end of the first airflow arrester, wherein the customizing comprises breaking the second airflow arrester along one horizontal score line of a plurality of horizontal score lines predefined within the second airflow arrester, and wherein the securing comprises placing the second airflow arrester over the second electronics rack and securing the one vertical end thereof to one of the first vertical end or second vertical end of the first airflow arrester.

\* \* \* \* \*